US011852674B2

(12) United States Patent
Wu et al.

(10) Patent No.: US 11,852,674 B2
(45) Date of Patent: Dec. 26, 2023

(54) METHOD FOR LOCATING OPEN CIRCUIT FAILURE POINT OF TEST STRUCTURE

(71) Applicant: Shanghai Huali Microelectronics Corporation, Shanghai (CN)

(72) Inventors: Cheng Wu, Shanghai (CN); Shuqing Duan, Shanghai (CN); Jinde Gao, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 13 days.

(21) Appl. No.: 17/896,336

(22) Filed: Aug. 26, 2022

(65) Prior Publication Data
US 2023/0160951 A1  May 25, 2023

(30) Foreign Application Priority Data

Nov. 19, 2021  (CN) .......................... 202111392016.8

(51) Int. Cl.
*G01R 31/28* (2006.01)
*H05K 1/02* (2006.01)
*H05K 3/00* (2006.01)

(52) U.S. Cl.
CPC ....... *G01R 31/2836* (2013.01); *H05K 1/0268* (2013.01); *H05K 3/00* (2013.01)

(58) Field of Classification Search
None
See application file for complete search history.

(56) References Cited

U.S. PATENT DOCUMENTS

| 5,959,459 | A  | * | 9/1999  | Satya   | G01R 31/307 |
|           |    |   |         |         | 324/501 |
| 7,764,078 | B2 | * | 7/2010  | Feustel | H01L 22/34 |
|           |    |   |         |         | 324/754.03 |
| 2004/0262604 | A1 | * | 12/2004 | Lee | H01L 22/34 |
|           |    |   |         |         | 257/48 |
| 2020/0043815 | A1 | * | 2/2020 | Lee | G06T 7/0006 |
| 2023/0273101 | A1 | * | 8/2023 | Chen | G01N 23/04 |
|           |    |   |         |         | 250/307 |

FOREIGN PATENT DOCUMENTS

| CN | 113224035 | A | * | 8/2021 | ......... G01R 31/2601 |
| CN | 115497846 | A | * | 12/2022 | ............. H01L 22/14 |

\* cited by examiner

*Primary Examiner* — Jermele M Hollington
(74) *Attorney, Agent, or Firm* — Banner & Witcoff, Ltd.

(57) ABSTRACT

The present application discloses a method for locating an open circuit failure point of a test structure, which includes the following steps: step 1: providing a sample formed with a test structure, a first metal layer pattern and a second metal layer pattern of the test structure forming a series resistor structure through each via; step 2: performing a first active voltage contrast test to the sample to show an open circuit point and making a first scratch mark at an adjacent position of the open circuit point; step 3: forming a coating mark at the first scratch mark on the sample; step 4: performing a second active voltage contrast test to the sample to show the open circuit point and locating a relative position of the open circuit point by using a position of the coating mark as a reference position.

18 Claims, 9 Drawing Sheets

FIG. 7B1

METHOD FOR LOCATING OPEN CIRCUIT FAILURE POINT OF TEST STRUCTURE

CROSS-REFERENCES TO RELATED APPLICATIONS

This application claims the priority to Chinese patent application No. 202111392016.8, filed on Nov. 19, 2021, the disclosure of which is incorporated herein by reference in its entirety.

TECHNICAL FIELD

The present application relates to a method for manufacturing a semiconductor integrated circuit, in particular to a method for locating an open circuit failure point of a test structure.

BACKGROUND

Open circuit is one of the most common circuit failures, which mainly comes from design problems and process problems. Open circuit test is a common test item of Wafer Acceptance Test (WAT) in the semiconductor manufacturing process. The resistance of the whole test structure is tested to determine whether there is an open circuit problem. If there is an open circuit problem, it is necessary to use Failure Analysis (FA) to find the open circuit point and infer the root cause of the open circuit. Failure analysis is divided into electrical analysis and physical analysis. For the open circuit problem, electrical analysis is usually used as a starting point, professional electrical failure locating equipment is used to realize the locating of the open circuit point, and then the physical performance of the open circuit is determined by using physical analysis equipment to deduce the root cause of the open circuit. The locating of the open circuit point is a very critical step.

There are many kinds of test structures for the online monitoring of the open circuit failure, one of which is chain test structure, that is, the test structure is a chain structure. Referring to FIG. 1A, it is a top view of an existing chain test structure. Referring to FIG. 1B, it is a sectional structural diagram of the existing chain test structure FIG. 1A. The test structure 101 includes a lower layer structure, an intermediate layer and an upper layer structure. The lower layer structure includes a plurality of first metal layer patterns 103, the intermediate layer includes a plurality of vias 104, and the upper layer structure includes a plurality of second metal layer patterns 102. Each first metal layer pattern 103 and each second metal layer pattern 102 form a series resistor structure through each via 104. The second metal layer patterns 102 at two ends of the series resistor structure form a first test end 102a and a second test end 102b.

The first metal layer patterns 103 and the second metal layer patterns 102 are connected head to tail through the vias 104 to form a chain structure.

At present, Passive Voltage Contrast (PVC) and Active Voltage Contrast (AVC) are the two most commonly used methods for FA to locate the open circuit failure point. Both of them use the grounded structure and floating structure to show obvious light and dark contrast differences in a Scanning Electron Microscope (SEM) to locate the open circuit failure point.

Referring to FIG. 2A, it is a schematic diagram showing a dark spot when the test object is a floating structure in the existing voltage contrast test. By scanning the floating structure 201 with an electron beam 202, the surface of the floating structure 201 will accumulate positive charges, which will affect the moving trajectory of secondary electrons escaping from the surface of the sample, thus affecting the number of secondary electrons collected by an SEM detector. In FIG. 2A, the positive charge is represented by reference sign 204, and the secondary electron is represented by reference sign 203. Because the number of secondary electrons collected by the SEM detector is small, the floating structure 201 will be displayed as a dark spot.

Referring to FIG. 2B, it is a schematic diagram showing a bright spot when the test object is a grounded structure in the existing voltage contrast test. By scanning the grounded structure 301 with an electron beam 302, the grounded structure 301 will discharge positive charges generated in the test to the ground, and the generated secondary electrons will be collected by the SEM detector, so the grounded structure 301 will be displayed as a bright spot. In FIG. 2B, the secondary electron is represented by reference sign 303.

By comparing FIG. 2A and FIG. 2B, it can be seen that the number of secondary electrons collected by the SEM detector at the floating structure 201 is smaller than that at the grounded structure 301, and the brightness shown by the floating structure 201 will be lower than that shown by the grounded structure 301.

An existing method for locating an open circuit point by adopting PVC includes the following steps:

One end of the test structure is broken down by laser and grounded. At this time, the whole structure is divided into a grounded structure and a floating structure with the open circuit point as the dividing point, that is, the structure between the grounded end of the test structure and the open circuit point is grounded, so it is a grounded structure; the other end of the test structure to the open circuit point will not be connected with the ground, so it is a floating structure.

After that, the sample is put into an SEM and scanned by using a low-voltage electron beam. The number of secondary electrons collected by the SEM detector at the floating structure is smaller than that at the grounded structure. The brightness shown by the floating structure will be lower than that shown by the grounded structure. The bright-dark junction is the open circuit point.

The existing method for locating the open circuit point by adopting PVC has the following defects:

The first defect is that if two ends of the test structure are grounded, two ends of the open circuit point are grounded structures, so there will be no bright-dark junction and the open circuit point cannot be located.

The second defect is that when the test structure is large enough, the capacity of the test structure to contain charges is large enough, so even if the test structure is not grounded, it is equivalently grounded. Therefore, the position between the open circuit point and the ungrounded end is equivalently grounded, so there will be no bright-dark junction and it is impossible to locate the open circuit point. Referring to FIG. 3, it is a photo 401 of the surface of the existing chain test structure when the PVC test is performed to the existing chain test structure illustrated in FIG. 1A. It can be seen that each area of the test structure is actually equivalently grounded, so each area of the test structure shows a bright spot 402, so the bright-dark junction cannot be obtained.

The above two defects make the test circuit locate the open circuit point by adopting AVC. The existing nano probe machine can realize a variety of testing functions, one of which is AVC testing. Therefore, AVC test may be implemented by adopting a nano probe machine. An existing AVC test method includes the following steps:

The nano probe machine is used to set one end of the test structure as a positive potential and the other end as a negative potential. In this way, a sufficiently large potential difference will be formed at the two ends of the test structure, and an obvious bright-dark contrast field will appear in the area from the open circuit point to the positive potential end and in the area from the open circuit point to the negative potential, so that the open circuit failure point can be located by using the bright-dark junction position.

In the open circuit failure analysis, the locating of the open circuit failure point is a very key step. The advantage of PVC is that it can use Focused Ion Beam (FIB) to directly perform open circuit point locating and slicing, and then perform TEM analysis. However, PVC cannot locate the open circuit point of the large-area test structure.

AVC can only be implemented in test equipment such as nano probe machine, and the test structure can only show the bright-dark contrast difference in the nano probe machine. However, once the sample is taken out of the nano probe machine, the open circuit point cannot be seen. If the open circuit point appears at the edge of the test structure, the AVC photo can be scanned and stored, then the open circuit point can be located by using the method of counting the number of structures and finally slicing analysis is performed. The method of counting the number of structures includes calculating the number of structures such as metal layer patterns between the open circuit point and the edge of the test structure.

However, if the test structure is very large and the open circuit point is located in the middle of the structure, the method of counting the number of structures on the AVC scanning image will not easily locate the exact position of the open circuit point in the actual sample, which makes it very difficult to slice and analyze the open circuit point later.

BRIEF SUMMARY

The present application provides a method for locating an open circuit failure point of a test structure, which can realize the accurate locating of the open circuit point through the active voltage contrast test, and is applicable to the locating of the open circuit point of the large-area test structure with the open circuit point that cannot be located by adopting the passive voltage contrast test.

The method for locating the open circuit failure point of the test structure provided by the present application includes the following steps:
  step 1: providing a sample formed with a test structure,
    the test structure including a lower layer structure, an intermediate layer and an upper layer structure, the lower layer structure including a plurality of first metal layer patterns, the intermediate layer including a plurality of vias, the upper layer structure including a plurality of second metal layer patterns, each first metal layer pattern and each second metal layer pattern forming a series resistor structure through each via, and the second metal layer patterns at two ends of the series resistor structure forming a first test end and a second test end;
    the first metal layer patterns of the lower layer structure being isolated by a lower layer interlayer film;
    the second metal layer patterns of the upper layer structure and the vias of the intermediate layer being isolated by an upper layer interlayer film;
    the upper layer structure further including a metal diffusion blocking layer, the metal diffusion blocking layer covering surfaces of the second metal layer patterns and the upper interlayer film;
    removing the metal diffusion blocking layer on tops of the first test end and the second test end in the test structure of the sample to expose the first test end and the second test end;
  step 2: performing a first active voltage contrast test to the sample to show an open circuit point of the test structure, making a first scratch mark at an adjacent position of the open circuit point, and then ending the first active voltage contrast test;
  step 3: finding the first scratch mark on the sample and forming a coating mark at the first scratch mark;
  step 4: performing a second active voltage contrast test to the sample to show the open circuit point and locating a relative position of the open circuit point by using a position of the coating mark as a reference position according to a feature that the coating mark is adjacent to the open circuit point.

In some cases, the first active voltage contrast test is implemented in a nano probe station.

In some cases, the second active voltage contrast test is implemented in the nano probe station.

In some cases, the nano probe station includes a plurality of nano probes;
  in step 2 and step 4, a first nano probe is connected with one of the first test end and the second test end, a second nano probe is connected with the other of the first test end and the second test end, the first nano probe inputs a first voltage, the second nano probe inputs a second voltage, and the first voltage and the second voltage have a difference so that a voltage difference is constructed in the series resistor structure at the first test end and the second test end.

In some cases, in step 2, the first scratch mark is obtained by scraping with a third nano probe.

In some cases, in step 2, after forming the first scratch mark, the method further includes:
  moving the third nano probe in parallel or perpendicularly to form a second scratch mark on a first edge of the test structure.

In some cases, the first edge is an edge closest to the first scratch mark in edges of the test structure.

In some cases, in step 3, a method for finding the first scratch mark includes:
  firstly, finding the second scratch mark on the first edge of the test structure;
  then moving the sample in parallel or perpendicularly to find the first scratch mark.

In some cases, in step 1, the metal diffusion blocking layer on the tops of the first test end and the second test end is removed by adopting FIB.

In some cases, in step 1, a top metal interconnection structure is further formed on a top of the test structure;
  before removing the metal diffusion blocking layer at the tops of the first test end and the second test end in the test structure of the sample, the method further includes:
  performing a polishing process to remove the top metal interconnection structure of the sample to expose the metal diffusion blocking layer.

In some cases, the materials of the first metal layer patterns, the second metal layer patterns and the vias include copper.

In some cases, the material of the metal diffusion blocking layer includes N Doped SiC (NDC).

In some cases, in step 2 and step 4, after piercing, the nano probe station scans the sample by adopting an electron beam.

In some cases, the coating material of the coating mark includes carbon;

the coating mark is formed through electron beam irradiation.

In some cases, the coating mark is formed in an SEM machine or FIB machine.

In some cases, the method for locating the open circuit failure point of the test structure further includes:

step 5: performing slicing by adopting FIB to fabricate a TEM sample, the coating mark and the relative position being used to locate the open circuit point in the slicing process.

In some cases, the test structure is a chain structure.

Because the active voltage contrast test can only show the open circuit point in the test process, when the active voltage contrast test is ended, the open circuit point cannot be observed on the sample. As a result, when the test structure size of the sample is large, in the existing methods, using the active voltage contrast test cannot achieve the accurate locating of the open circuit point. The present application overcomes the disadvantage of the prior art, adopts two active voltage contrast tests, and makes the first scratch mark at the adjacent position of the open circuit point by using the first active voltage contrast test. In this way, after the first active voltage contrast test, the position of the first scratch mark can be found on the sample and a coating mark can be formed on the first scratch mark. Because the coating mark is formed by coating, the structure and size of the coating mark are accurate. Then, the second active voltage contrast test is performed. Because there is the coating mark on the sample in the second active voltage contrast test and the coating mark is located at the adjacent position of the open circuit point, the relative positions of the open circuit point and the coating mark can be accurately obtained, so that the accurate locating of the open circuit point can be realized through the coating mark and the obtained relative positions. Therefore, the present application can finally realize the accurate locating of the open circuit point through the active voltage contrast test, and is applicable to the locating of the open circuit point of the large-area test structure with the open circuit point that cannot be located by adopting the passive voltage contrast test.

BRIEF DESCRIPTION OF THE DRAWINGS

The present application will be described in further detail below in combination with the specific embodiments with reference to the drawings.

DETAILED DESCRIPTION

Figure 4:
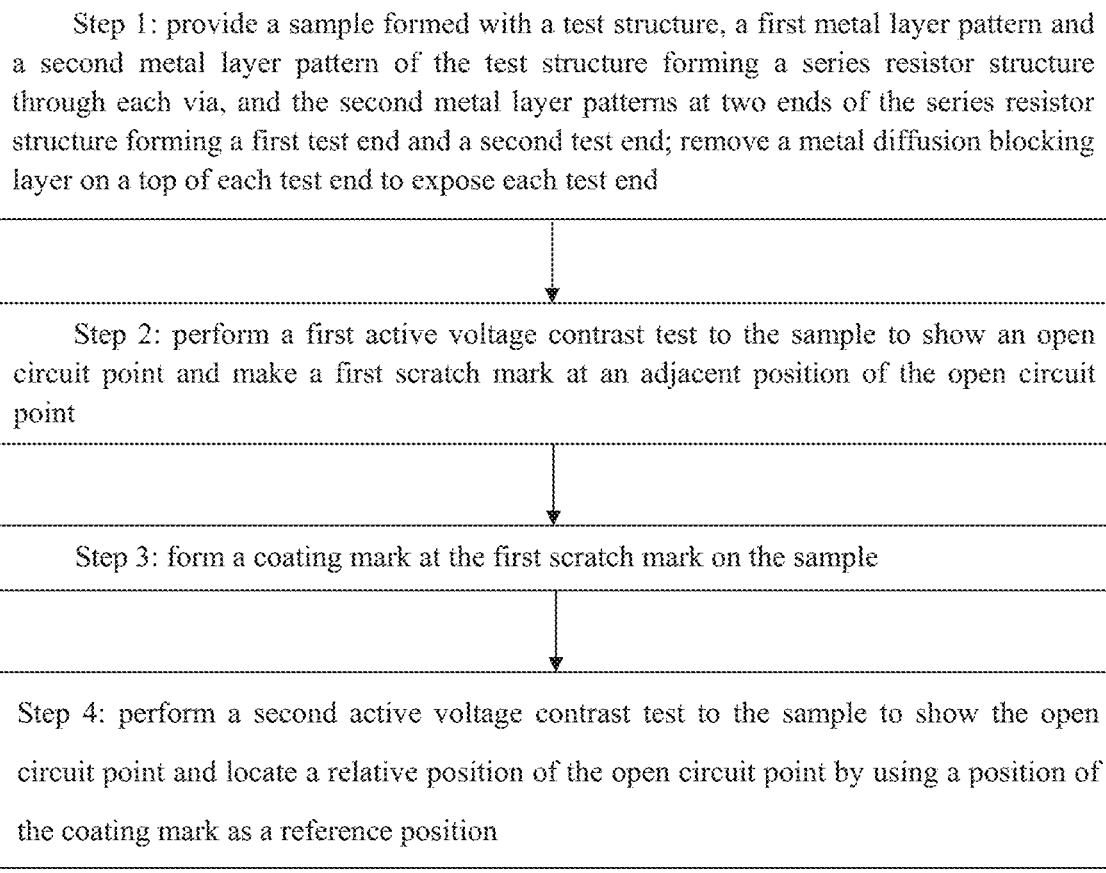
FIG. 4 illustrates a flowchart of a method for locating an open circuit failure point of a test structure according to an embodiment of the present application.
Figure 5A:
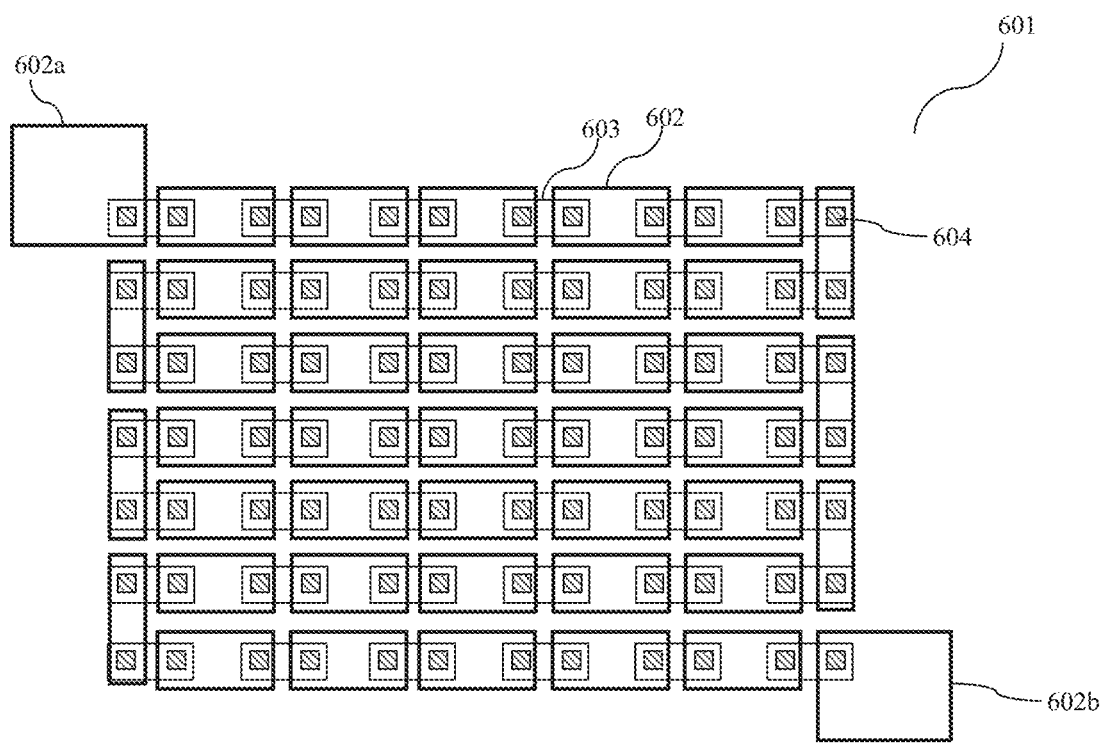
FIG. 5A illustrates a top view of a test structure adopted in a method for locating an open circuit failure point of a test structure according to an embodiment of the present application.
Figure 5B:
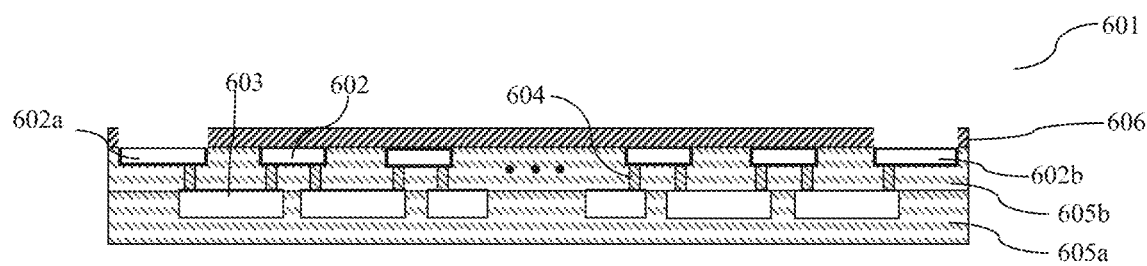
FIG. 5B illustrates a sectional structural diagram of the test structure illustrated in FIG. 5A.

Referring to FIG. 4, it illustrates a flowchart of a method for locating an open circuit failure point of a test structure 601 according to an embodiment of the present application. Referring to FIG. 5A, it illustrates a top view of the test structure 601 adopted in the method for locating the open circuit failure point of the test structure 601 according to an embodiment of the present application. FIG. 5B illustrates a sectional structural diagram of the test structure 601 illustrated in FIG. 5A. Referring to FIG. 6A to FIG. 6E, they illustrate schematic diagrams of a surface of the test structure 601 in each step of the method for locating the open circuit failure point of the test structure 601 according to an embodiment of the present application. Referring to FIG. 7A to FIG. 7E, they illustrate photos of the surface of the test structure 601 in each step of the method for locating the open circuit failure point of the test structure 601 according to an embodiment of the present application. The method for locating the open circuit failure point of the test structure 601 according to an embodiment of the present application includes the following steps:

In step 1, a sample formed with a test structure 601 is provided.

Referring to FIG. 5A, the test structure 601 includes a lower layer structure, an intermediate layer and an upper layer structure. The lower layer structure includes a plurality of first metal layer patterns 603. The intermediate layer includes a plurality of vias 604. The upper layer structure includes a plurality of second metal layer patterns 602. Each first metal layer pattern 603 and each second metal layer pattern 602 form a series resistor structure through each via 604. The second metal layer patterns 602 at two ends of the series resistor structure form a first test end 602a and a second test end 602b.

In the embodiment of the present application, the test structure 601 is a chain structure. Each first metal layer pattern 603 and each second metal layer pattern 602 are connected head to tail through the vias 604 to form a chain structure.

Referring to FIG. 5B, the first metal layer patterns 603 of the lower layer structure are isolated by a lower layer interlayer film 605a.

The second metal layer patterns 602 of the upper layer structure and the vias 604 of the intermediate layer are isolated by an upper layer interlayer film 605b.

The upper layer structure further includes a metal diffusion blocking layer 606. The metal diffusion blocking layer 606 covers surfaces of the second metal layer patterns 602 and the upper interlayer film 605b.

The metal diffusion blocking layer 606 on tops of the first test end 602a and the second test end 602b in the test structure 601 of the sample is removed to expose the first test end 602a and the second test end 602b.

In the embodiment of the present application, the metal diffusion blocking layer 606 on the tops of the first test end 602a and the second test end 602b is removed by adopting FIB.

A top metal interconnection structure is further formed on a top of the test structure 601. Before removing the metal diffusion blocking layer 606 at the tops of the first test end 602a and the second test end 602b in the test structure 606 of the sample, the method further includes:

performing a polishing process to remove the top metal interconnection structure of the sample to expose the metal diffusion blocking layer 606.

The materials of the first metal layer patterns 603, the second metal layer patterns 602 and the vias 604 include copper.

The material of the metal diffusion blocking layer 606 includes NDC.

Figure 6A:
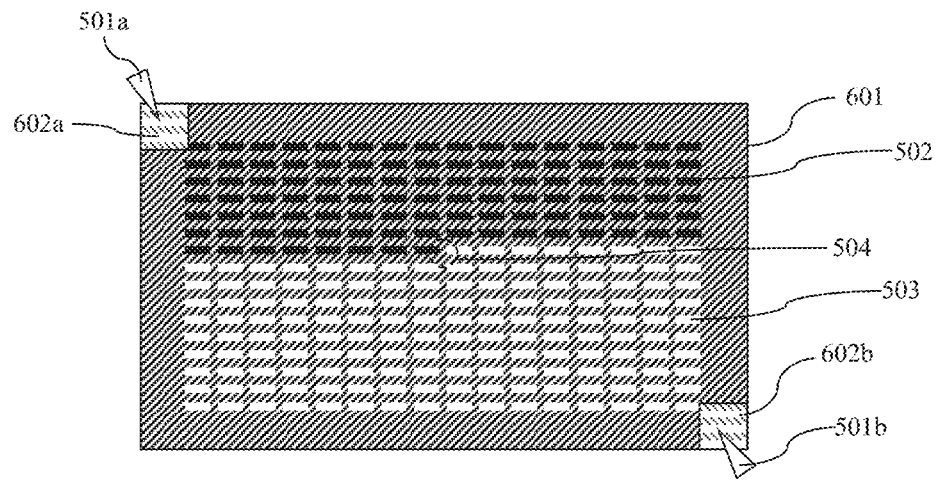
FIG. 6A to FIG. 6E illustrate schematic diagrams of a surface of a test structure in each step of a method for locating an open circuit failure point of a test structure according to an embodiment of the present application.

In step 2, referring to FIG. 6A, a first active voltage contrast test is performed to the sample to show an open circuit point of the test structure 601. In FIG. 6A, the open circuit point is as illustrated by a dashed circle 504.

In the embodiment of the present application, the first active voltage contrast test is implemented in a nano probe station. The nano probe station includes a plurality of nano probes. A first nano probe 501a is connected with one of the first test end 602a and the second test end 602b. A second nano probe 501b is connected with the other of the first test end 602a and the second test end 602b. The first nano probe 501a inputs a first voltage. The second nano probe 501b inputs a second voltage. The first voltage and the second voltage have a difference so that a voltage difference is constructed in the series resistor structure at the first test end 602a and the second test end 602b. After piercing, the nano probe station scans the sample by adopting an electron beam and then collects secondary electrons. The contrast of different areas of the test structure 601 is determined according to the number of secondary electrons collected. In FIG. 6A, the first nano probe 501a is connected to the first test end 602a, the first voltage is positive, the second nano probe 501b is connected to the second test end 602b and the second voltage is negative. In this way, dark spots 502 are displayed between the first test end 602a and the open circuit point, and bright spots 503 are displayed between the open circuit point and the second test end 602b. The dark spots 502 and the bright spots 503 are located right above the corresponding second metal layer patterns 602.

Figure 7A:
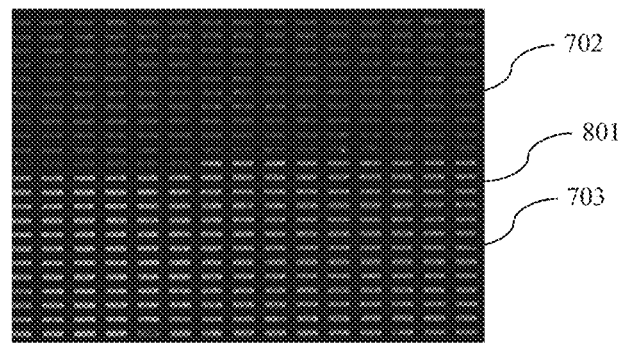
FIG. 7A to FIG. 7E illustrate photos of a surface of a test structure in each step of a method for locating an open circuit failure point of a test structure according to an embodiment of the present application.

A photo corresponding to the first active voltage contrast test is as illustrated in FIG. 7A, with dark spots 702 and bright spots 703 on the test structure 801.

Figure 6B:
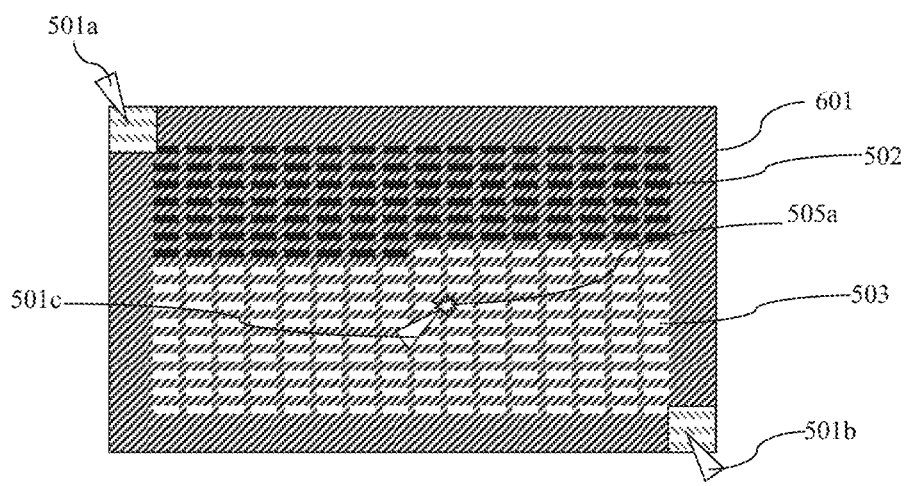

Referring to FIG. 6B, a first scratch mark 505a is made at an adjacent position of the open circuit point.

In the embodiment of the present application, the first scratch mark 505a is obtained by scraping with a third nano probe 501c.

Figure 1A:
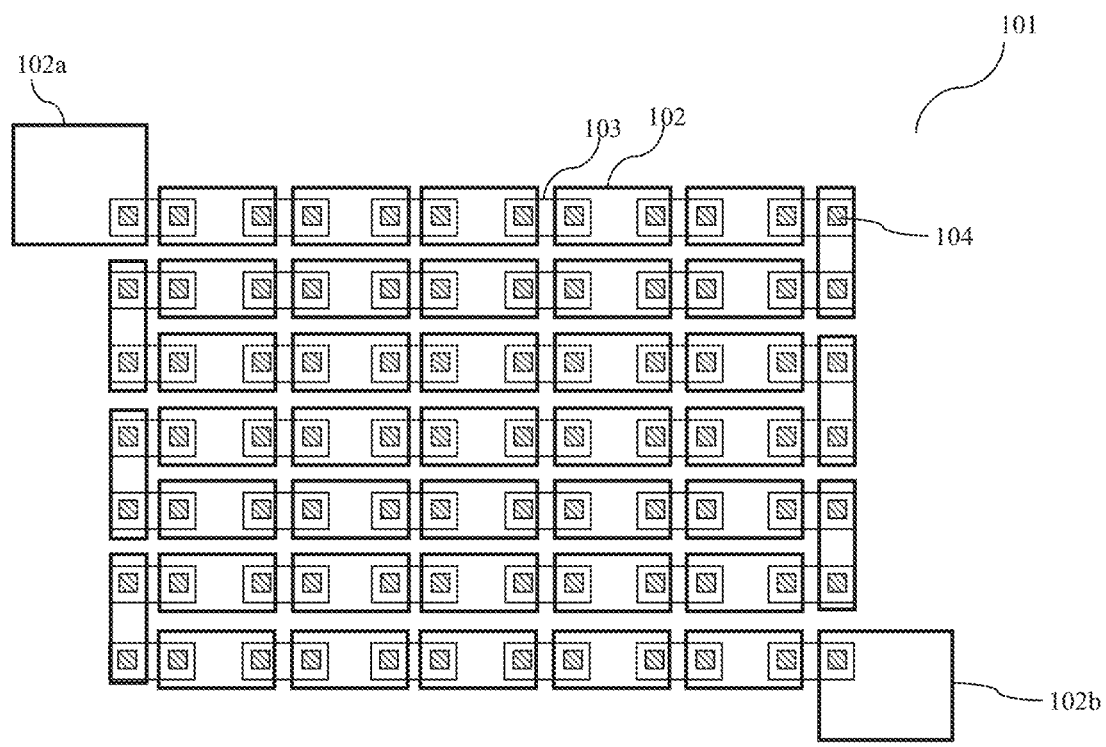
FIG. 1A illustrates is a top view of an existing chain test structure.
Figure 1B:
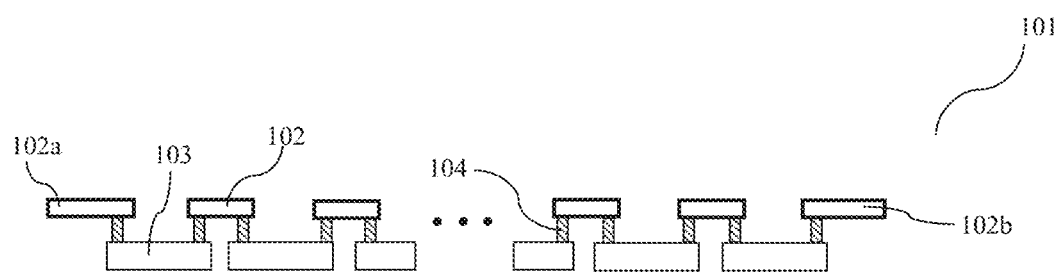
FIG. 1B illustrates a sectional structural diagram of the existing chain test structure FIG. 1A.
Figure 2A:
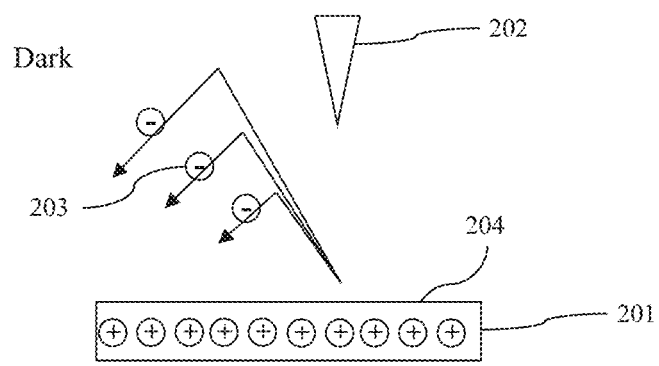
FIG. 2A illustrates a schematic diagram showing a dark spot when a test object is a floating structure in an existing voltage contrast test.
Figure 2B:
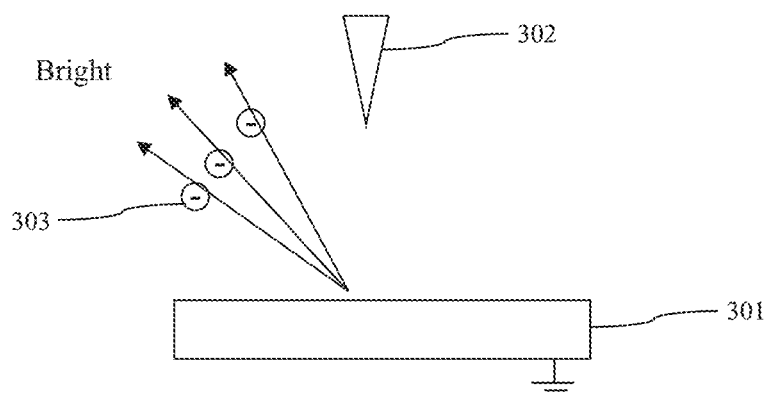
FIG. 2B illustrates a schematic diagram showing a bright spot when a test object is a grounded structure in an existing voltage contrast test.
Figure 3:
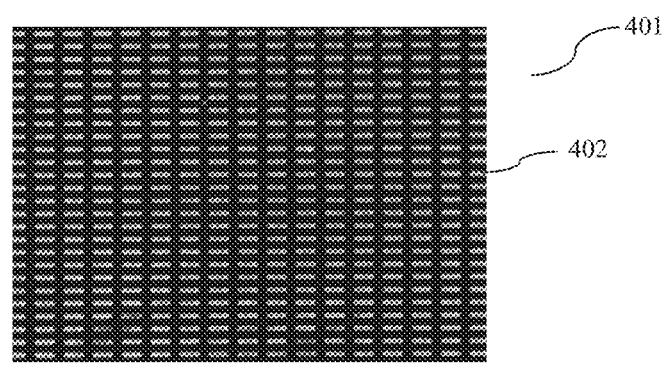
FIG. 3 illustrates a photo of a surface of the existing chain test structure when a PVC test is performed to the existing chain test structure illustrated in FIG. 1A.
Figure 7B:
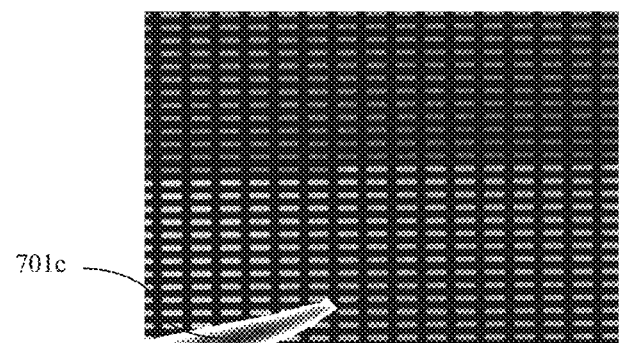

An actual photo of the step corresponding to FIG. 6B is as illustrated in FIG. 7B. A third nano probe 701c is adopted. The first scratch mark is formed on the test structure 801. FIG. 7B1 illustrates a photo of the first scratch mark, which is located in a dashed box 705a.

Further, the first scratch mark 505a is about 3 μm away from the open circuit point. If the distance between the first scratch mark 505a and the open circuit point is too short, it is easy to damage the open circuit point; if the distance between the first scratch mark 505a and the open circuit point is too long, the relative position in the subsequent step 4 is too large, which is not conducive to the locating of the open circuit point.

Figure 6C:
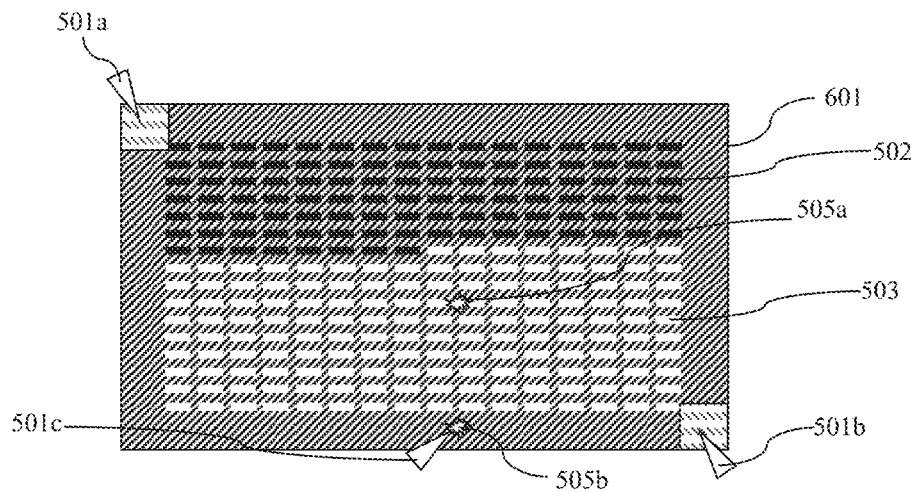

Referring to FIG. 6C, after forming the first scratch mark 505a, the method further includes:

moving the third nano probe 501c in parallel or perpendicularly to form a second scratch mark 505b on a first edge of the test structure 601.

The first edge is an edge closest to the first scratch mark 505a in edges of the test structure 601.

Figure 7C:
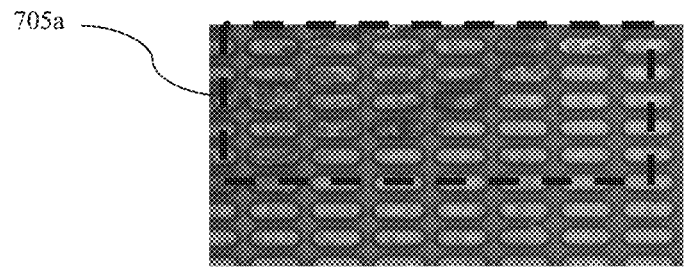
Figure 7C:
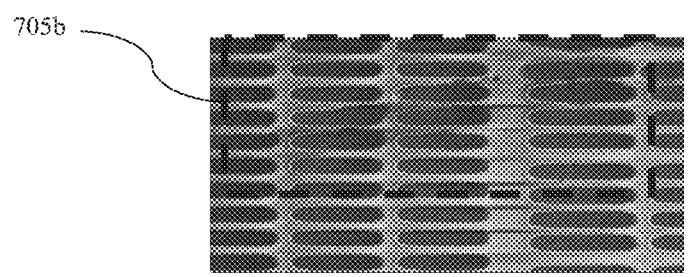

FIG. 7C illustrates a photo of the second scratch mark, which is located in a dashed box 705b.

Figure 6D:
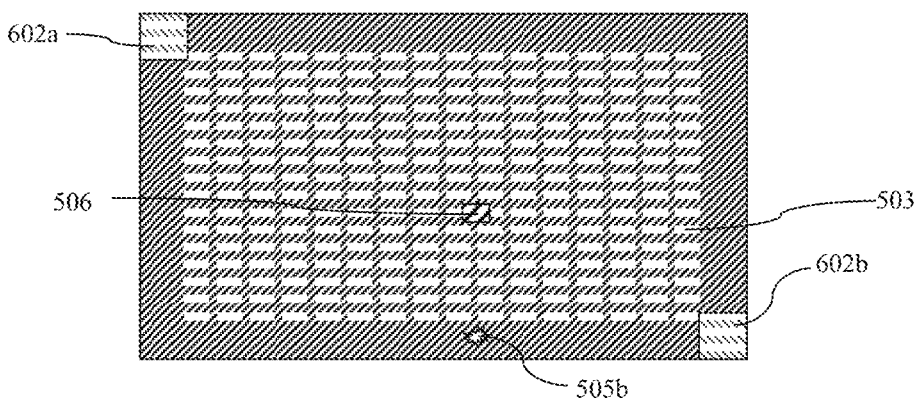

Referring to FIG. 6D, then the first active voltage contrast test is ended. The first active voltage contrast test will no longer show different bright and dark areas, so the open circuit point cannot be displayed.

In step 3, referring to FIG. 6D, the first scratch mark 505a is found on the sample and a coating mark 506 is formed at the first scratch mark 505a.

In the embodiment of the present application, a method for finding the first scratch mark 505a includes:

firstly, finding the second scratch mark 505b on the first edge of the test structure 601;

then moving the sample in parallel or perpendicularly to find the first scratch mark 505a.

When the test structure 601 is relatively large, if the second scratch mark 505b is not set, it is not easy to directly find the first scratch mark 505a. After setting the second scratch mark 505b, because the second scratch mark 505b is located on the first edge, the second scratch mark 505b can be directly found on the first edge, which is relatively easy to achieve. After finding the second scratch mark 505b, since the second scratch mark 505b and the first scratch mark 505a are on the same line, it is also easy to find the first scratch mark 505a.

The coating material of the coating mark 506 includes carbon.

Further, the coating mark 506 is formed through electron beam irradiation. The coating mark 506 is formed in an SEM machine or FIB machine.

The coating mark 506 is a rectangle of 1 μm*0.5 μm in the top view.

Figure 7D:
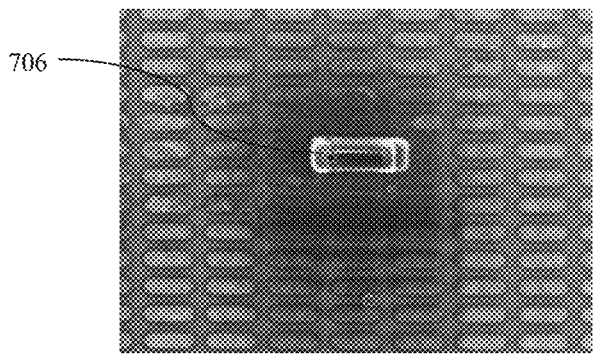

FIG. 7D illustrates a photo of the coating mark 706.

Figure 6E:
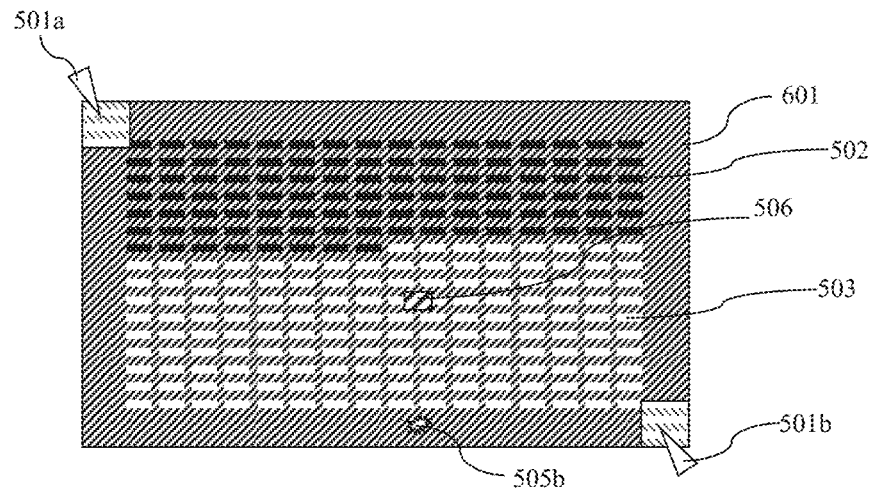

In step 4, referring to FIG. 6E, a second active voltage contrast test is performed to the sample to show the open circuit point and a relative position of the open circuit point is located by using a position of the coating mark 506 as a reference position according to a feature that the coating mark 506 is adjacent to the open circuit point.

In the embodiment of the present application, the second active voltage contrast test is implemented in the nano probe station.

Figure 7E:
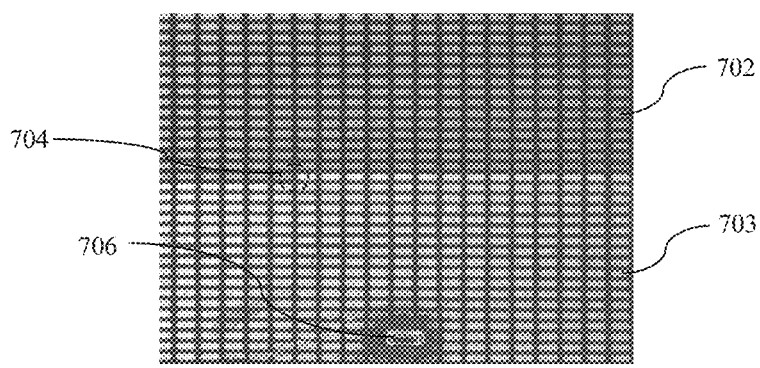

A photo corresponding to the second active voltage contrast test is as illustrated in FIG. 7E. FIG. 7E illustrates the relative positions of the coating mark 706 and the open circuit point. The open circuit point is located at the position corresponding to a dashed circle 704. In an embodiment, since the dark spots 702 and bright spots 703 in FIG. 7E correspond to the unit pattern structures of the test structure, such as the second metal layer patterns 602, the relative position of the open circuit point can be obtained by counting the number of the dark spots 702 and bright spots 703.

Thereafter, the method further includes the following step:

In step 5, slicing is performed by adopting FIB to fabricate a TEM sample. The coating mark and the relative position are used to locate the open circuit point in the slicing process.

Because the active voltage contrast test can only show the open circuit point in the test process, when the active voltage contrast test is ended, the open circuit point cannot be observed on the sample. As a result, when the test structure 601 size of the sample is large, in the existing methods, using the active voltage contrast test cannot achieve the accurate locating of the open circuit point. The embodiment of the present application overcomes the disadvantage of the prior art, adopts two active voltage contrast tests, and makes the first scratch mark 505a at the adjacent position of the open circuit point by using the first active voltage contrast test. In this way, after the first active voltage contrast test, the position of the first scratch mark 505a can be found on the sample and a coating mark 506 can be formed on the first scratch mark 505a. Because the coating mark 506 is formed by coating, the structure and size of the coating mark 506 are accurate. Then, the second active voltage contrast test is performed. Because there is the coating mark 506 on the sample in the second active voltage contrast test and the coating mark 506 is located at the adjacent position of the open circuit point, the relative positions of the open circuit point and the coating mark 506 can be accurately obtained, so that the accurate locating of the open circuit point can be realized through the coating mark 506 and the obtained relative positions. Therefore, the embodiment of the present application can finally realize the accurate locating of the open circuit point through the active voltage contrast test, and is applicable to the locating of the open circuit point of the large-area test structure 601 with the open circuit point that cannot be located by adopting the passive voltage contrast test.

The present application has been described in detail through the specific embodiments, which, however, do not constitute limitations to the present application. Without departing from the principle of the present application, those skilled in the art may also make many modifications and improvements, which should also be considered as included in the scope of protection of the present application.

What is claimed is:

1. A method for locating an open circuit failure point of a test structure, comprising:
   step 1: providing a sample formed with the test structure, the test structure comprising a lower layer structure, an intermediate layer, and an upper layer structure, the lower layer structure comprising a plurality of first metal layer patterns, the intermediate layer comprising a plurality of vias, the upper layer structure comprising a plurality of second metal layer patterns, each first metal layer pattern and each second metal layer pattern forming a series resistor structure through each via, and the second metal layer patterns at two ends of the series resistor structure forming a first test end and a second test end,
   the first metal layer patterns of the lower layer structure being isolated by a lower layer interlayer film,
   the second metal layer patterns of the upper layer structure and the vias of the intermediate layer being isolated by an upper layer interlayer film,
   the upper layer structure further comprising a metal diffusion blocking layer, the metal diffusion blocking layer covering surfaces of the second metal layer patterns and the upper interlayer film, and
   removing the metal diffusion blocking layer on tops of the first test end and the second test end in the test structure of the sample to expose the first test end and the second test end;
   step 2: performing a first active voltage contrast test to the sample to show an open circuit point of the test structure, making a first scratch mark at an adjacent position of the open circuit point, and then ending the first active voltage contrast test;
   step 3: finding the first scratch mark on the sample and forming a coating mark at the first scratch mark; and
   step 4: performing a second active voltage contrast test to the sample to show the open circuit point and locating a relative position of the open circuit point by using a position of the coating mark as a reference position according to a feature that the coating mark is adjacent to the open circuit point.

2. The method for locating the open circuit failure point of the test structure according to claim 1, wherein the first active voltage contrast test is implemented in a nano probe station.

3. The method for locating the open circuit failure point of the test structure according to claim 2, wherein the second active voltage contrast test is implemented in the nano probe station.

4. The method for locating the open circuit failure point of the test structure according to claim 3, wherein the nano probe station comprises a plurality of nano probes; and
   in step 2 and step 4, a first nano probe is connected with one of the first test end and the second test end, a second nano probe is connected with the other of the first test end and the second test end, the first nano probe inputs a first voltage, the second nano probe inputs a second voltage, and the first voltage and the second voltage have a difference so that a voltage difference is constructed in the series resistor structure at the first test end and the second test end.

5. The method for locating the open circuit failure point of the test structure according to claim 4, wherein, in step 2, the first scratch mark is obtained by scraping with a third nano probe.

6. The method for locating the open circuit failure point of the test structure according to claim 5, wherein, in step 2, after forming the first scratch mark, the method further comprises:
   moving the third nano probe in parallel or perpendicularly to form a second scratch mark on a first edge of the test structure.

7. The method for locating the open circuit failure point of the test structure according to claim 6, wherein the first edge is an edge closest to the first scratch mark in edges of the test structure.

8. The method for locating the open circuit failure point of the test structure according to claim 6, wherein, in step 3, the finding the first scratch mark comprises:
   firstly, finding the second scratch mark on the first edge of the test structure; and
   then moving the sample in parallel or perpendicularly to find the first scratch mark.

9. The method for locating the open circuit failure point of the test structure according to claim 1, wherein, in step 1, the metal diffusion blocking layer on the tops of the first test end and the second test end is removed by adopting focused ion beam (FIB).

10. The method for locating the open circuit failure point of the test structure according to claim 1, wherein, in step 1, a top metal interconnection structure is further formed on a top of the test structure, and before the removing the metal diffusion blocking layer at the tops of the first test end and the second test end in the test structure of the sample, the method further comprises:
performing a polishing process to remove the top metal interconnection structure of the sample to expose the metal diffusion blocking layer.

11. The method for locating the open circuit failure point of the test structure according to claim 1, wherein materials of the first metal layer patterns, the second metal layer patterns, and the vias comprise copper.

12. The method for locating the open circuit failure point of the test structure according to claim 11, wherein a material of the metal diffusion blocking layer comprises N doped SiC (NDC).

13. The method for locating the open circuit failure point of the test structure according to claim 4, wherein, in step 2 and step 4, after piercing, the nano probe station scans the sample by adopting an electron beam.

14. The method for locating the open circuit failure point of the test structure according to claim 1, wherein a coating material of the coating mark comprises carbon, and the coating mark is formed through electron beam irradiation.

15. The method for locating the open circuit failure point of the test structure according to claim 14, wherein the coating mark is formed in a scanning electron microscope (SEM) machine or FIB machine.

16. The method for locating the open circuit failure point of the test structure according to claim 1, wherein the method for locating the open circuit failure point of the test structure further comprises:
step 5: performing slicing by adopting FIB to fabricate a TEM sample, the coating mark and the relative position being used to locate the open circuit point in the slicing process.

17. The method for locating the open circuit failure point of the test structure according to claim 1, wherein the test structure is a chain structure.

18. The method for locating the open circuit failure point of the test structure according to claim 1, wherein, in step 2, the open circuit point is located at a bright-dark junction shown in the first active voltage contrast test; and
in step 4, the open circuit point is located at a bright-dark junction shown in the second active voltage contrast test.

* * * * *